United States Patent

Ghahghahi

Patent Number: 6,115,910
Date of Patent: *Sep. 12, 2000

[54] MISREGISTRATION FIDUTIAL

[75] Inventor: Farshad Ghahghahi, San Jose, Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/853,154

[22] Filed: May 8, 1997

[51] Int. Cl.⁷ .................................................. H05K 3/30
[52] U.S. Cl. ............................................ 29/833; 29/832
[58] Field of Search ........................... 428/209; 437/208, 437/209; 361/762; 228/103; 257/692; 29/847, 832, 833, 831, 837

[56] References Cited

U.S. PATENT DOCUMENTS

| | | | |
|---|---|---|---|
| 5,250,843 | 10/1993 | Eichelberger | 257/692 |
| 5,385,289 | 1/1995 | Bloch et al. | 228/103 |
| 5,517,756 | 5/1996 | Shirai et al. | 29/847 |
| 5,518,964 | 5/1996 | DiStefano et al. | 437/209 |
| 5,710,063 | 1/1998 | Forehand et al. | 437/208 |
| 5,723,205 | 3/1998 | Millette et al. | 428/209 |
| 5,724,232 | 3/1998 | Bhatt et al. | 361/762 |

*Primary Examiner*—Lee Young
*Assistant Examiner*—Rick Kiltae Chang

[57] ABSTRACT

A misregistration fidutial structure and method for verifying registration between multiple layers of multi-layer subassembly for an electronic device. A substrate for the subassembly is provided, where a first layer, typically having electrically conductive signal paths, is placed over the substrate. A second layer, typically a soldermask, is placed over the first layer. An aperture is formed in the second layer a predetermined horizontal distance from a conductive signal path in the underlying first layer so that through visual observation one can easily determine whether misregistration is present when any portion of the underlying signal conductive path is observable through the second layer aperture.

7 Claims, 2 Drawing Sheets

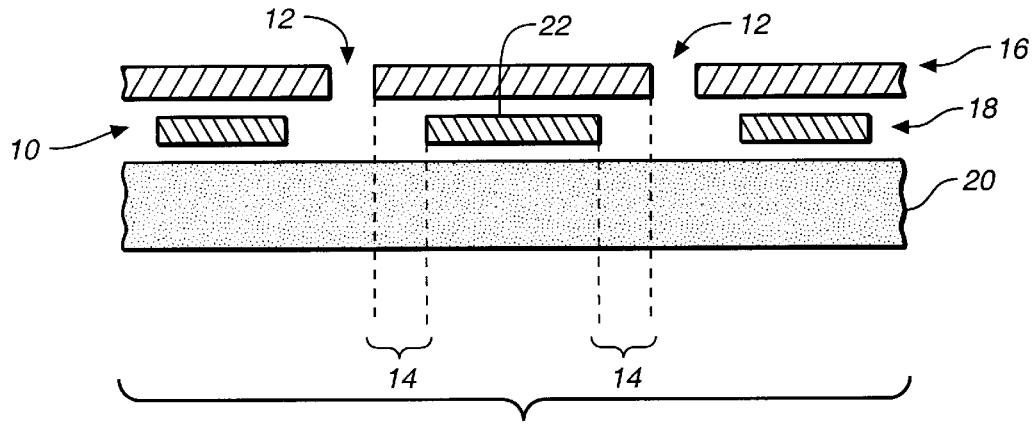
FIG._1
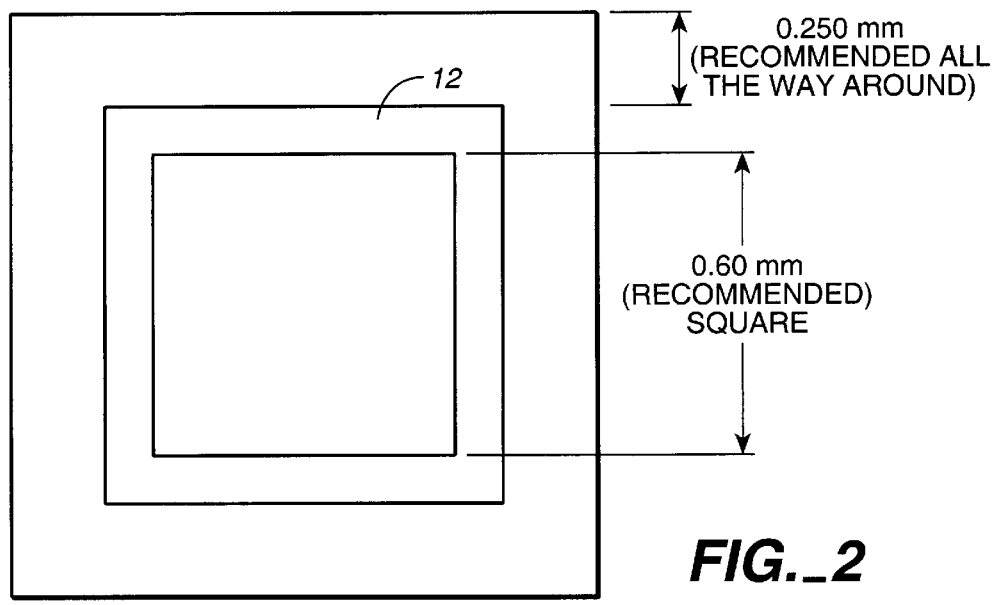
FIG._2

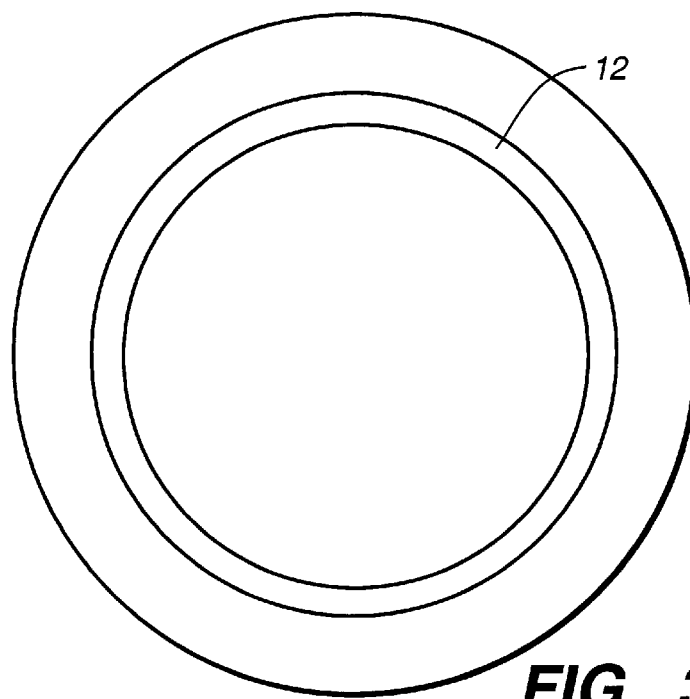
FIG._3
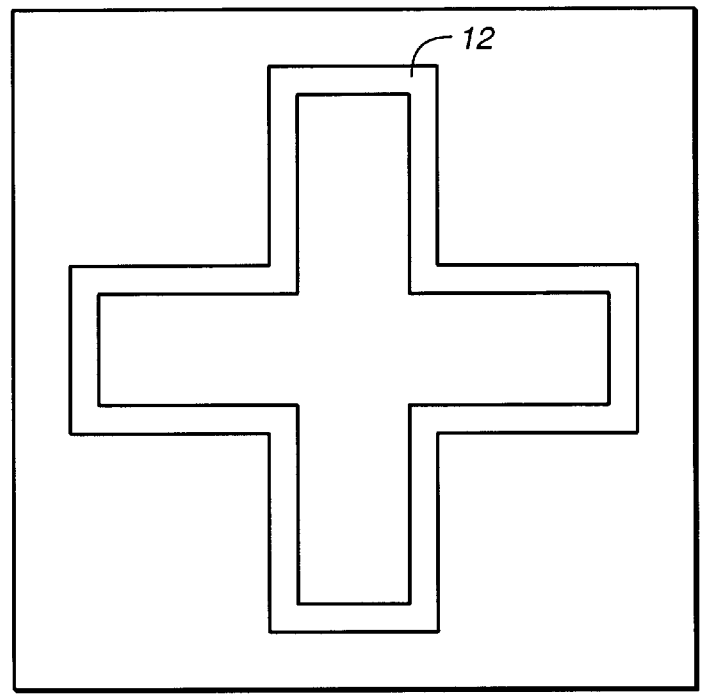
FIG._4

MISREGISTRATION FIDUTIAL

BACKGROUND OF THE INVENTION

1. Field of the Invention.

This invention relates to a structure and method of verifying the registration of various layers of a multi-layer substrate. More particularly, this invention relates to a misregistration fidutial structure and method for verifying registration of an underlying conductive layer as seen through an aperture in an overlaying soldermask layer in a multi-layered electronic device.

2. Discussion of Related Technology.

Previously, to verify registration, or alignment, between two layers on a multi-layered electronic device subassembly, the subassembly had to be examined under a high power microscope. The feature sizes then had to be compared against a specification to determine proper registration of the layers with respect to each other. Such a method presents distinct disadvantages.

Another common method of verifying registration requires that a cross-section of the device be taken for examination.

It is desirable that visual observation of misregistration between the layers through an aperture be available at one or more locations on an electronic package subassembly. This type of fidutial would assure that any misalignment between a soldermask layer and an underlying conductive layer can be easily observed without requiring the use of a high power microscope, or that a cross-section of the subassembly be made and examined.

SUMMARY OF THE INVENTION

Herein described is a method of verifying registration of multiple layers of a multi-layer subassembly for an electronic device, including a misregistration fidutial structure for verifying the registration between the layers. The subassembly is for any electronic device which utilizes multi-layers deposited on or otherwise positioned near all or a portion of an underlying substrate which is part of a subassembly. The substrate may be silicon or gallium arsenide for an integrated circuit package, or may be BT Epoxy, polyimide, ceramic or other similar suitable material, if the electronic device is a printed wiring board. A first layer overlies the substrate. The first layer typically includes a plurality of electrically conductive signal pads. A second layer is provided to overlay the first layer, where the second layer typically includes a soldermask.

An aperture is formed in the second layer a predetermined horizontal distance from at least one of the conductive signal paths in the underlying first layer. This aperture forms the misregistration fidutial structure which can be visually checked to determine whether any portion of a conductive signal path of the underlying first layer is observable through the second layer aperture.

If any portion of the underlying signal path is observable through the aperture, the subassembly is rejected due to improper misregistration between the layers of the subassembly. Thus, there is no need for a high-powered microscope or a cross section of the substrate to be taken to determine this misregistration. This improves the efficiency of manufacture of the subassemblies and greatly reduces the cost of testing and checking registration.

BRIEF DESCRIPTION OF THE DRAWINGS

FIG. 1 is a cross-sectional view of a portion of the multi-layers of an electronic package subassembly utilizing the misregistration fidutial structure and method of the present invention;

FIG. 2 illustrates an embodiment of the misregistration fidutial structure of the present invention;

FIG. 3 illustrates another embodiment of the misregistration fidutial structure of the present invention; and FIG. 4 illustrates an additional embodiment of the misregistration fidutial of the present invention.

DETAILED DESCRIPTION OF THE PREFERRED EMBODIMENTS

During the assembly of an electronic device, such as a printed wiring board or an integrated circuit package, it is common for multiple layers of conductive or non-conductive materials to be applied over one another on a substrate which forms a subassembly for the electronic device. For example, FIG. 1 illustrates a portion of two layers of a multi-layer subassembly 10 of an electronic device. Underlying substrate 20 for an integrated circuit may be silicon or gallium arsenide. For a printed wiring board, substrate 20 may be BT Epoxy, polyimide, ceramic, or any other suitable material. In either case, a first conductive layer 18 is deposited onto, adhered to, or otherwise positioned to overlay all or a portion of the top surface of substrate 20. This first layer 18 includes a plurality of electrically conductive signal paths 22 disposed within the first layer 18. Deposited onto, adhered to, or otherwise positioned to overlay all or a portion of the uppermost surface of first layer 18 is a second layer 16. This second layer 16 may be, for example, a soldermask, or may be a second conductive layer. Preferably, second layer 16 is a soldermask layer.

Referring to FIG. 1, to avoid alignment and misregistration problems between the multiple layers of the multi-layer subassembly 10, an aperture 12 is formed in the second layer 16. Aperture 12 within second layer 16 is formed a predetermined horizontal distance 14 from the underlying signal path 22. By visually observing down through the aperture 12 in the second layer 16, one may easily discern whether there is a misalignment or misregistration between the underlying first layer 18 with respect to the overlaying layer 16. The misregistration determination is accomplished by either visually looking through aperture 12, or by using a camera, or other visual observation device, which can scan down through the aperture 12 to determine whether any portion of signal path 22 is observable through aperture 12.

The placement of aperture 12 is such that it is formed in the second layer 16 to be offset from signal path 22 a pre-determined horizontal distance 14. The predetermined horizontal distance 14 is measured from the edge of signal path 22 to the edge of aperture 12, as illustrated in FIG. 1. The greater the predetermined horizontal distance 14 of aperture 12 from the underlying signal path 22, the more tolerance is given for any misregistration between the multi-layers. The smaller the predetermined horizontal distance 14, the smaller the misregistration tolerance. Misregistration justifies a rejection of the subassembly. Thus, a rejection of the subassembly 10 would occur when any portion of the underlying signal path 22 of the first layer 16 would be visible through the aperture 12 formed in the second layer 16.

FIG. 2 illustrates an embodiment of the pattern for the aperture 12 misregistration fidutial structure which may be utilized in the second layer 16 of the subassembly 10. Likewise, FIGS. 3 and 4 illustrate further embodiments of the aperture 12 misregistration fidutial structure.

This method and misregistration fidutial structure may be formed in one, two, three or four corners of any plastic or ceramic integrated circuit package substrate, or in the corners of the substrate of a printed wiring board. This method and structure could be applied to any type of substrate in any electronic device where there is an underlying conductive trace layer and an overlaying soldermask or other non-conductive material layer.

These embodiments and examples described above are illustrative of various embodiments of the fidutial and method of the present invention. Those of skill in the art may recognize that other embodiments are encompassed within the scope of the claims set forth herein.

What is claimed is:

1. A method of verifying registration of multiple layers of a multi-layer subassembly for an electronic device, comprising the steps of:

a) providing a substrate for a subassembly of an electronic device;

b) providing a first layer overlaying said substrate, wherein said first layer includes a plurality of electrically conductive signal paths;

c) providing a second layer overlaying said first layer, wherein said second layer includes a soldermask;

d) forming an aperture in said second layer, wherein said aperture is positioned a predetermined horizontal distance from at least one of said plurality of conductive signal paths in said first layer when the first and second layers are in a proper registration;

e) determining whether the first and second layers are properly registered or are misregistered by inspecting through the aperture in said second layer to detect whether any portion of a conductive signal path of said first layer is observable through the aperture in said second layer;

f) rejecting said subassembly if any portion of a conductive signal path of said first layer is observable through the aperture in said second layer; and g) accepting said subassembly if no portion of any conductive signal path of said first layer is observable through the aperture in said second layer.

2. The method of claim 1, wherein said step of determining is accomplished by way of visual inspection.

3. The method of claim 1, wherein said electronic device is a printed wiring board.

4. The method of claim 1, wherein said electronic device is an integrated circuit package.

5. The method of claim 1, wherein said aperture is formed in a circular pattern.

6. The method of claim 1, wherein said aperture is formed in a box pattern.

7. The method of claim 1, wherein said aperture is formed in a cross pattern.

* * * * *